United States Patent
Tamadate

(10) Patent No.: US 8,693,211 B2
(45) Date of Patent: Apr. 8, 2014

(54) WIRING SUBSTRATE AND SEMICONDUCTOR DEVICE

(75) Inventor: Yuka Tamadate, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 129 days.

(21) Appl. No.: 13/356,919

(22) Filed: Jan. 24, 2012

(65) Prior Publication Data
US 2012/0120624 A1     May 17, 2012

Related U.S. Application Data

(62) Division of application No. 12/331,673, filed on Dec. 10, 2008, now abandoned.

(30) Foreign Application Priority Data

Dec. 12, 2007   (JP) .................................. 2007-321081

(51) Int. Cl.
    *H05K 7/00*     (2006.01)
(52) U.S. Cl.
    USPC ......................................... 361/777; 361/762
(58) Field of Classification Search
    USPC .................. 361/777, 760–764, 767, 768; 174/257–262
    See application file for complete search history.

(56) References Cited

U.S. PATENT DOCUMENTS

| 6,153,930 | A  | 11/2000 | Hori |
| 7,087,989 | B2 | 8/2006 | Nakayama |
| 7,355,126 | B2 | 4/2008 | Nishikawa et al. |

FOREIGN PATENT DOCUMENTS

| JP | 2006-351559 | 12/2006 |
| WO | 2004114402 | 12/2004 |

OTHER PUBLICATIONS

Japanese Office Action dated Sep. 18, 2012, 5 pages.

*Primary Examiner* — Jeremy Norris
*Assistant Examiner* — Tremesha S Willis
(74) *Attorney, Agent, or Firm* — Rankin, Hill & Clark LLP

(57) ABSTRACT

A wiring substrate 11 includes a wiring substrate main body 31 having a semiconductor element mounting area A, a wiring pattern 33 provided on an upper surface 31A of the wiring substrate main body 31 at a portion corresponding to the semiconductor element mounting area A, a solder resist 35 provided on the upper surface 31A of the wiring substrate main body 31 and having an opening portion 43 whose size is substantially equal to the semiconductor element mounting area A when viewed from a top, and a dam 37 provided on the solder resist 35 to block an underfill resin 13 provided in a clearance between the semiconductor element 12 and the wiring substrate main body 31. A distance between an inner wall of the opening portion 43 of the solder resist 35 and an inner wall of the dam 37 is partially varied.

21 Claims, 13 Drawing Sheets

WIRING SUBSTRATE AND SEMICONDUCTOR DEVICE

BACKGROUND OF THE INVENTION

1. Field of the Invention

The present invention relates to a wiring substrate and a semiconductor device. More particularly, the present invention relates to a wiring substrate including a wiring substrate main body, a wiring pattern having connection portions to which a semiconductor element is flip-chip bonded, a solder resist from which the connection portions are exposed, and a dam provided on the solder resist to block a underfill resin provided in a clearance between the semiconductor element and the wiring substrate main body, and a semiconductor device having the wiring substrate.

2. Description of Related Art

As a semiconductor device, there is a semiconductor device including a wiring substrate main body, a wiring pattern having connection portions to which a semiconductor element is flip-chip bonded, a solder resist from which the connection portions are exposed, an underfill resin provided in a clearance between the semiconductor element and the wiring substrate main body, and a dam provided on the solder resist to block the underfill resin (see FIG. 1).

FIG. 1 is a plan view of a semiconductor device of the related art. FIG. 2 is a sectional view of the semiconductor device shown in FIG. 1.

Referring to FIG. 1 and FIG. 2, a semiconductor device 200 of the related art includes a wiring substrate 201, a semiconductor element 202, an underfill resin 203, and external connection terminals 204.

The wiring substrate 201 has a wiring substrate main body 211 having a semiconductor element mounting area J in which the semiconductor element 202 is mounted, a wiring pattern 212, internal connection pads 214, a solder resist 216, a dam 217, and external connection pads 219.

The wiring substrate main body 211 is constructed by a plurality of insulating layers, vias and wirings formed in a plurality of insulating layers, and the like. The vias and the wirings provided on the wiring substrate main body 211 electrically connect the wiring pattern 212, the internal connection pads 214, and the external connection pads 219.

The wiring pattern 212 is provided on a portion of an upper surface 211A of the wiring substrate main body 211 corresponding to the semiconductor element mounting area J. The wiring pattern 212 has connection portions 222 to which a bump 209 is connected respectively.

The internal connection pads 214 are provided in an area of the upper surface 211A of the wiring substrate main body 211, which is positioned outside the semiconductor element mounting area J. The internal connection pads 214 are the pads that are electrically connected to a wiring substrate 206, on which an electronic component 207 is mounted, via an internal connection terminal 208.

The solder resist 216 is provided on the upper surface 211A of the wiring substrate main body 211. The solder resist 216 has opening portions 224, from which an upper surface of the internal connection pad 214 respectively, and an opening portion 225, which is formed to have a size substantially equal to the semiconductor element mounting area J when viewed from the top. The opening portion 225 is provided so as to penetrate a portion of the solder resist 216 corresponding to the semiconductor element mounting area J. Accordingly, the opening portion 225 exposes the wiring pattern 212 in the portion arranged in the semiconductor element mounting area J.

The dam 217 is provided on the solder resist 216 so as to surround the semiconductor element mounting area J. The shape of the dam 217 is a frame. The dam 217 blocks the underfill resin 203 such that, when the underfill resin 203 provided in a clearance between the wiring substrate 201 and the semiconductor element 202 is formed, the underfill resin 203 does not flow out to the internal connection pads 214. A distance M between an inner wall of the opening portion 225 of the solder resist 216 or an end portion of semiconductor element 202 and an inner wall of the dam 217 is set constant around a whole circumstance of the dam 217. The distance M can be set to 1.1 mm to 1.5 mm, for example. Also, a height of the dam 217 M can be set to 20 µm, for example.

The external connection pads 219 are provided on a lower surface 211B of the wiring substrate main body 211. The external connection pads 219 are used to provide the external connection terminals 204, which are connected to a mounting substrate (not shown) such as a mother board, or the like, respectively.

The semiconductor element 202 is flip-chip bonded to the connection portions 222. Concretely, the semiconductor element 202 is electrically connected to the connection portions 222 via the bumps 209 provided on electrode pads 226 of the semiconductor element 202, respectively. Lower ends of the bumps 209 are connected to the connection portions 222.

The underfill resin 203 prevents deterioration of reliability of the wiring pattern 212. That is, the underfill resin 203 improves a joining strength of connection portions between the bumps 209 and the connection portions 222, and also suppresses a occurrence of corrosion of the wiring pattern 212.

After the semiconductor element 202 is mounted on the wiring substrate 201, the underfill resin 203 is formed as follows. First, nozzles (not shown) for feeding the under fill resin are arranged so as to oppose to a groove 231. Here, the groove 231 is formed at underfill resin feeding area K and between an outer peripheral end of the semiconductor element 202 and an inner wall of the dam 217 (also see FIG. 1). Then, the underfill resin is fed from the nozzles while moving the nozzles as shown in allows N shown in FIG. 1. Thus fed underfill resin spreads over an interior of the inner circumference of the dam 217, reaches to an opposite corner of a corner where the underfill resin feeding area K and thus the underfill resin 203 is formed.

The external connection terminals 204 are provided on lower surfaces of the external connection pads 219. The external connection terminals 204 are the terminals that are connected to the mounting substrate (not shown) such as the mother board, or the like (see Japanese Patent Unexamined Publication JP-A-2006-351559, for example).

FIG. 3 is a plan view explaining the problem arisen in the semiconductor device of the related art, and FIG. 4 is a sectional view of the semiconductor device shown in FIG. 3. In FIG. 3 and FIG. 4, the same reference symbols are affixed to the same constituent portions as those of the semiconductor device 200 shown in FIG. 1 and FIG. 2 of the related art.

In the semiconductor device 200 of the related art, when a size of the surface of the semiconductor element 202 is increased (concretely, when a size of the semiconductor element 202 when viewed from the top is more than 10 mm square), an area P in which the underfill resin 203 is not filled is formed. The area P is in a clearance between a corner portion 202B of the semiconductor element 202 and the wiring substrate 201, which is positioned on the opposite side to a corner portion 202A of the semiconductor element 202 surrounded with the underfill resin feeding area K. Therefore, the wiring pattern 212 provided on the portion corresponding to this area P is not covered with the underfill resin 203. As a result, corrosion, electromigration and etc. are caused and thus reliability of the wiring pattern 212 is lowered.

SUMMARY OF THE INVENTION

Therefore, the present invention has been made in view of the above problems, and it is an object of the present invention to provide a wiring substrate capable of improving reliability of a wiring pattern to which a semiconductor element is flip-chip bonded, and a semiconductor device.

According to an aspect of the present invention, there is provided a wiring substrate, comprising:

a wiring substrate main body having a semiconductor element mounting area in which a semiconductor element is mounted;

a wiring pattern provided on a first surface of the wiring substrate main body at a portion corresponding to the semiconductor element mounting area, and having connection portions to which the semiconductor element is flip-chip bonded;

a solder resist provided on the first surface of the wiring substrate main body, and having an opening portion whose size is substantially equal to the semiconductor element mounting area, when viewed from a top; and a dam provided on an upper surface of the solder resist so as to surround the semiconductor element mounting area, for blocking an underfill resin provided in a clearance between the semiconductor element and the wiring substrate main body;

wherein a distance between an inner wall of the opening portion of the solder resist and an inner wall of the dam is partially varied.

According to the present invention, the distance between the inner wall of the opening portion of the solder resist and the inner wall of the dam partially varied. Therefore, when the underfill resin is to be formed in the clearance between the semiconductor element and the wiring substrate main body, a flowing direction of the underfill resin can be controlled by the inner wall of the dam. As a result, the wiring pattern located in the area where the underfill resin is hardly formed can be covered with the underfill resin with good precision, and thus reliability of the wiring pattern to which the semiconductor element is flip-chip bonded can be improved.

According to another aspect of the present invention, there is provided a semiconductor device, which includes the above described wiring substrate; the semiconductor element that is flip-chip bonded to the connection portions; and the underfill resin provided in the clearance between the semiconductor element and the wiring substrate.

According to the present invention, when forming the underfill resin in the clearance between the semiconductor element and the wiring substrate main body, the flowing direction of the underfill resin can be controlled by the inner wall of the dam. As a result, the wiring pattern located in the area where the underfill resin is hardly formed can be covered with the underfill resin with good precision, and thus reliability of the wiring pattern to which the semiconductor element is flip-chip bonded can be improved.

According to the present invention, reliability of the wiring patterns to which the semiconductor element is flip-chip bonded can be improved.

DETAILED DESCRIPTION OF EXEMPLARY EMBODIMENTS OF THE PRESENT INVENTION

Next, embodiments of the present invention will be explained with reference to the drawings hereinafter.

(First Embodiment)

Figure 1:
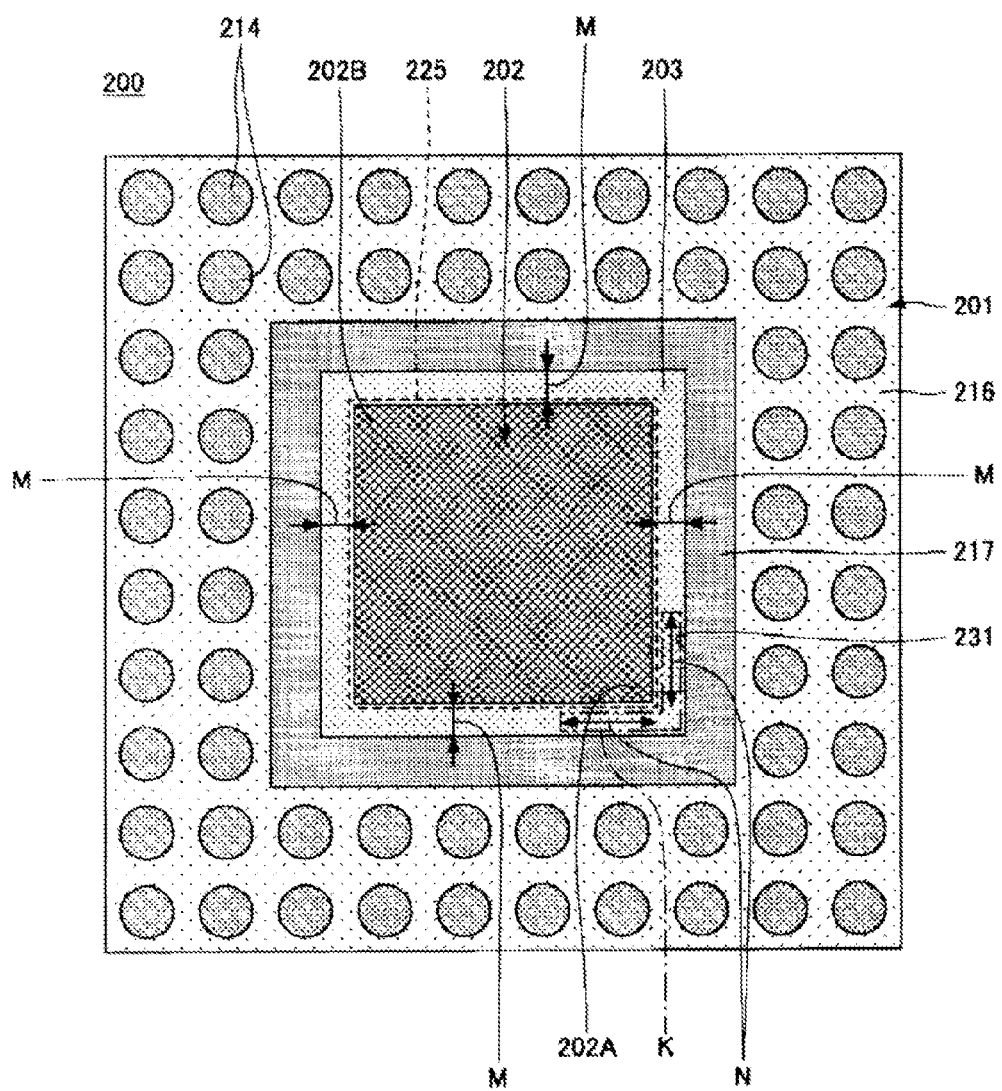
FIG. 1 is a plan view of a semiconductor device of the related art.
Figure 2:
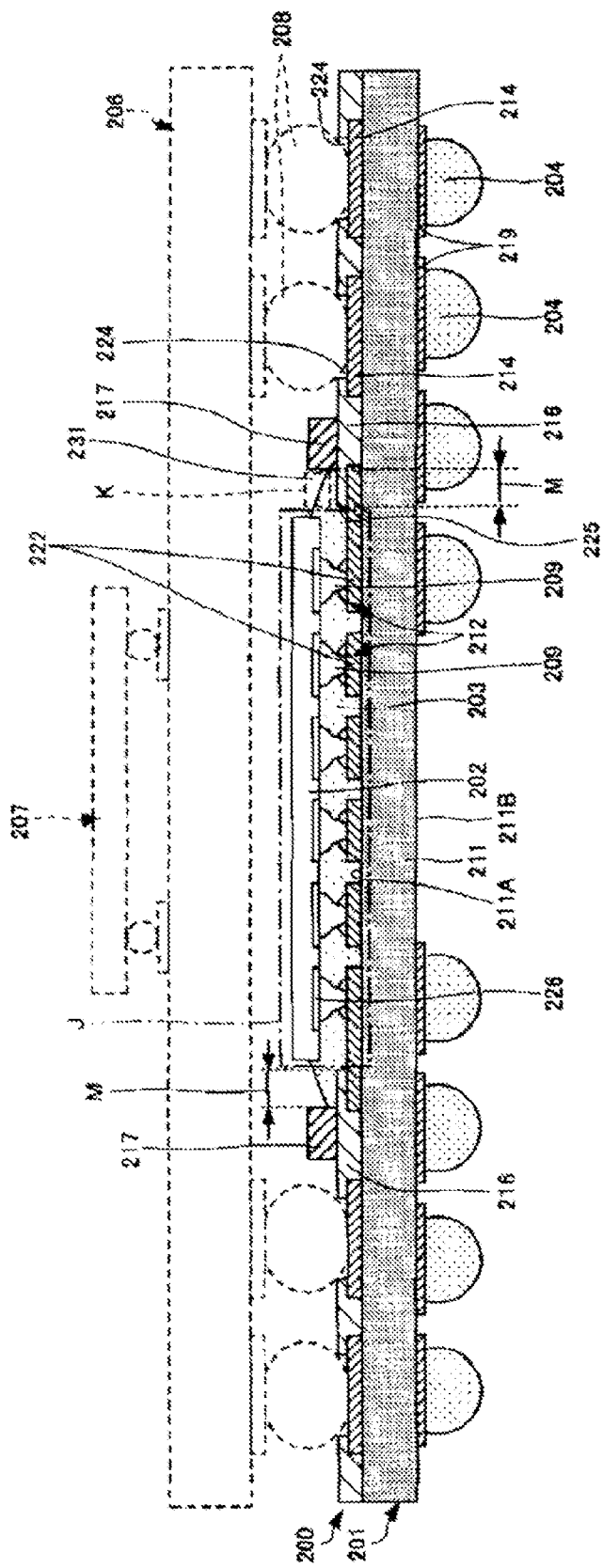
FIG. 2 is a sectional view of the semiconductor device shown in FIG. 1.
Figure 3:
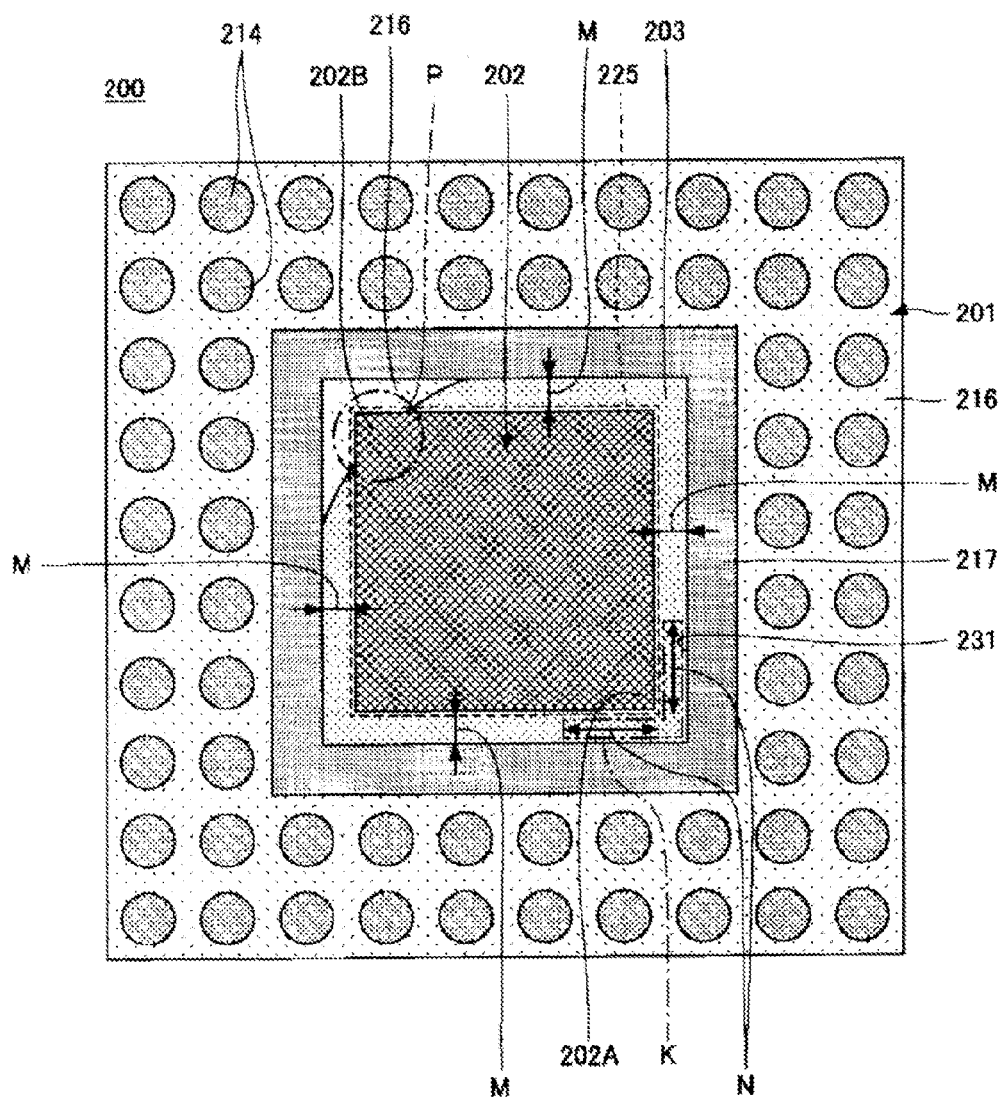
FIG. 3 is a plan view explaining the problem arisen in the semiconductor device of the related art.
Figure 4:
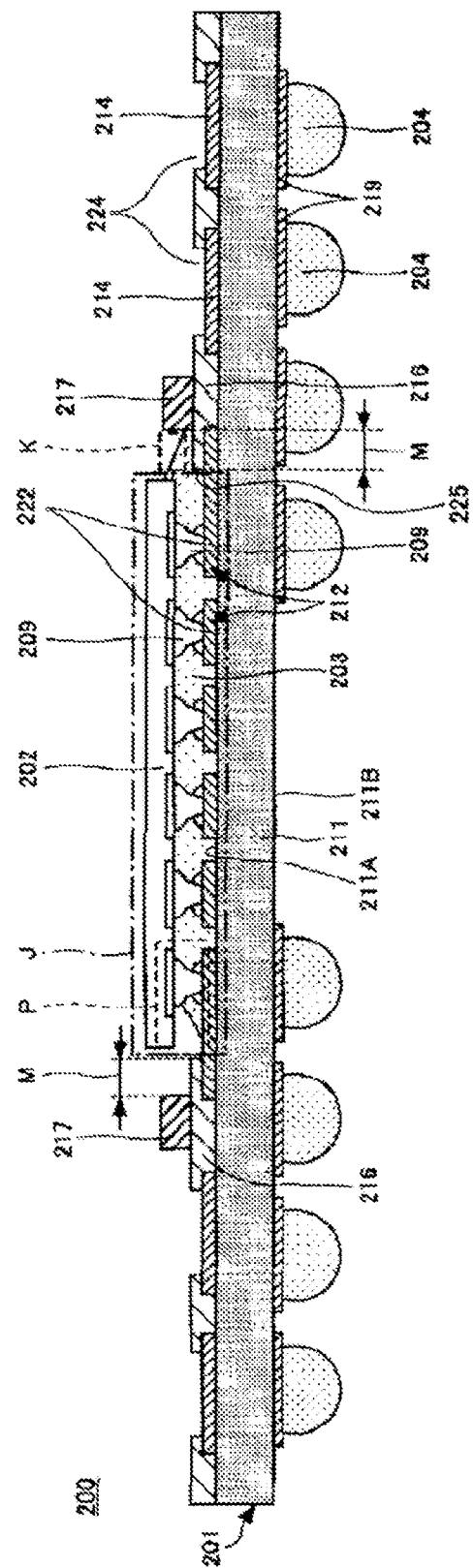
FIG. 4 is a sectional view of the semiconductor device shown in FIG. 3.
Figure 5:
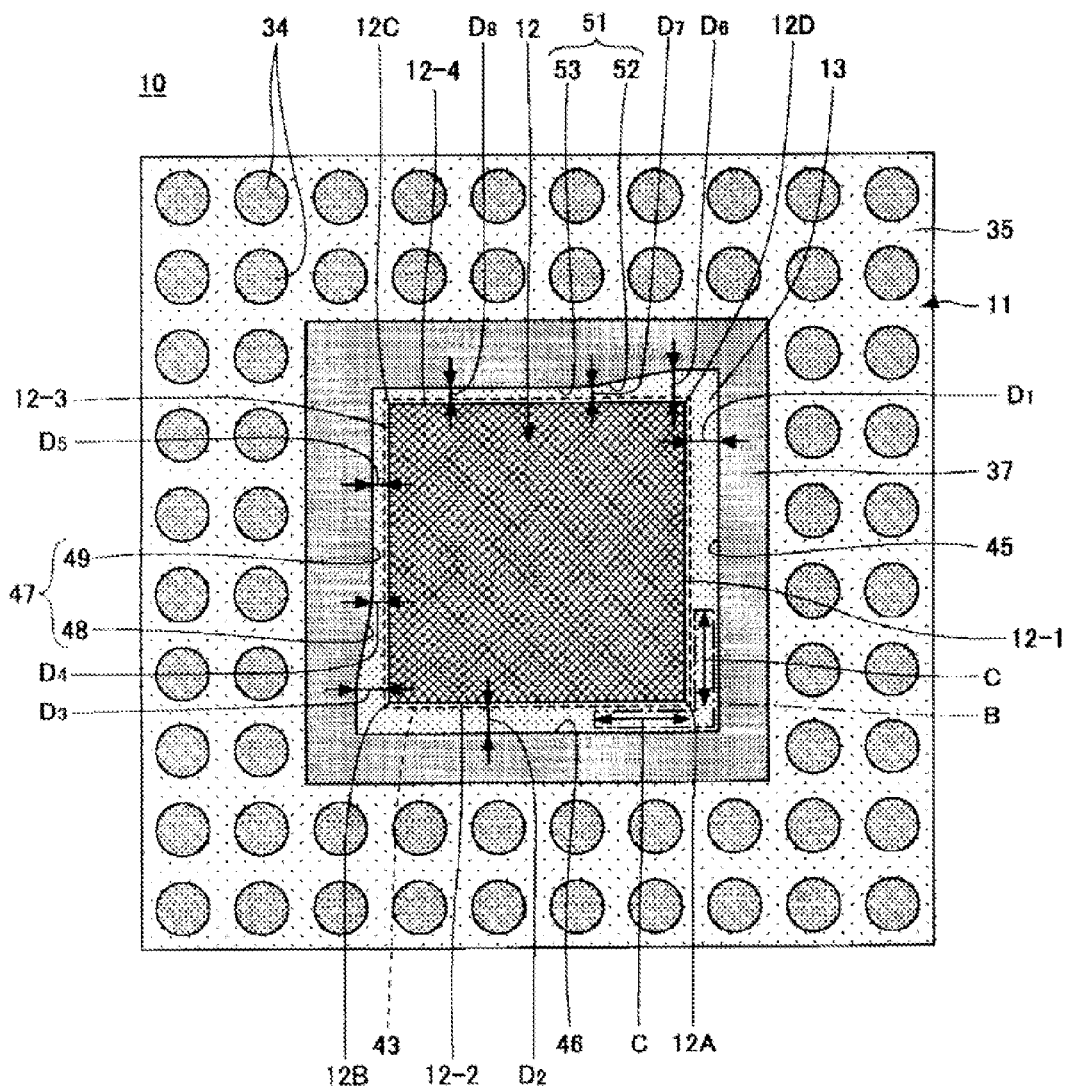
FIG. 5 is a plan view of a semiconductor device according to a first embodiment of the present invention.
Figure 6:
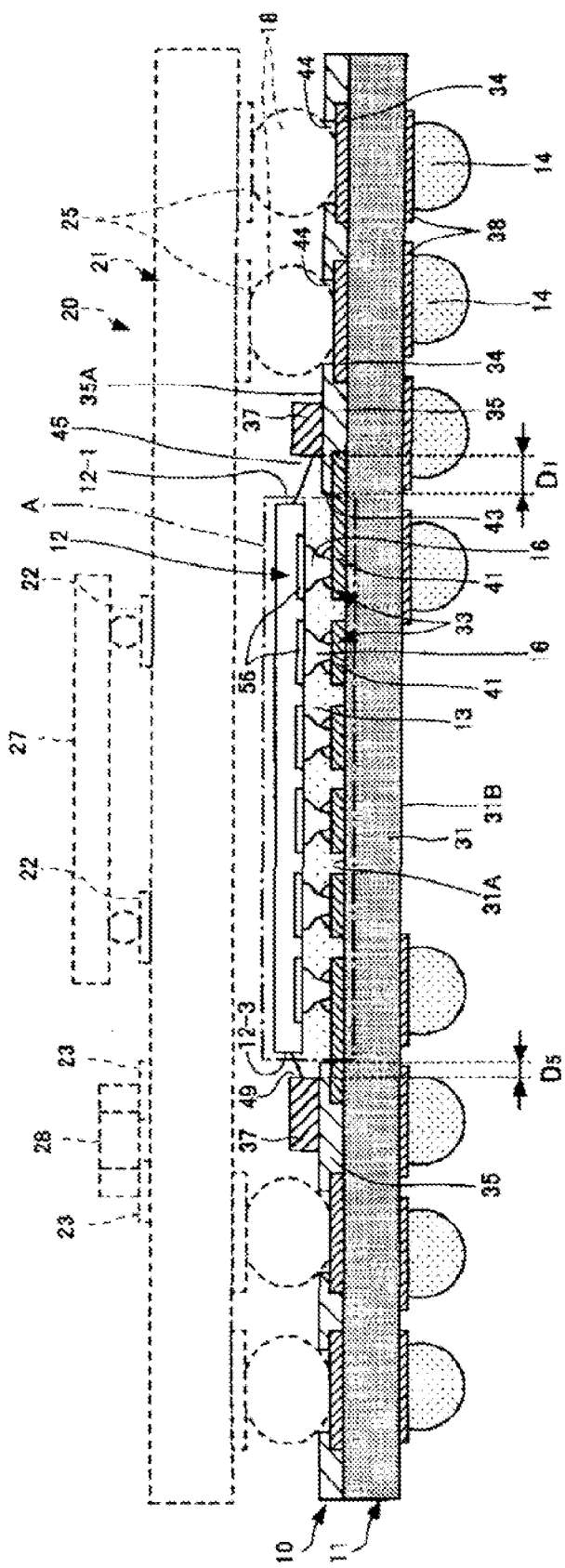
FIG. 6 is a sectional view of the semiconductor device shown in FIG. 5.

FIG. 5 is a plan view of a semiconductor device according to a first embodiment of the present invention, and FIG. 6 is a sectional view of the semiconductor device shown in FIG. 5.

By reference to FIG. 5 and FIG. 6, a semiconductor device 10 of the first embodiment includes a wiring substrate 11, a semiconductor element 12, an underfill resin 13, and an external connection terminal 14.

The wiring substrate 11 has a wiring substrate main body 31 having a semiconductor element mounting area A in which the semiconductor element 12 is mounted, a wiring pattern 33, internal connection pads 34, a solder resist 35, a dam 37, and external connection pads 38.

The wiring substrate main body 31 includes a plurality of insulating layers (for example, resin layers), and vias and wirings formed in a plurality of insulating layers, and the like. The vias and the wirings provided on the wiring substrate main body 31 electrically connect the wiring substrate main body 31, the internal connection pads 34, and the external connection pads 38. As the wiring substrate main body 31, for example, a coreless substrate, a build-up substrate with core having a core substrate, or the like can be employed.

The wiring pattern 33 is provided on a portion of an upper surface 31A (first surface) of the wiring substrate main body 31 corresponding to the semiconductor element mounting area A. The wiring pattern 33 has connection portions 41 to which bumps 16 provided on electrode pads 56 of the semiconductor element 12 are connected. The wiring pattern 33 is electrically connected to the internal connection pads 34 and the external connection pads 38 by vias and wirings (not shown) provided in the wiring substrate main body 31. The wiring pattern 33 is exposed from an opening portion 43 in the solder resist 35, described later, prior to a state that the underfill resin 13 is formed. As the wiring pattern 33, for example, a patterned metal film (concretely, e.g., Cu film) can be used.

The internal connection pads 34 are provided on the upper surface 31A of the wiring substrate main body 31, which is positioned outside the semiconductor element mounting area A. Upper surfaces of the internal connection pad 34 are exposed from opening portions 44 in the solder resist 35, described later. On the internal connection pads 34, an internal connection terminal 18 (e.g., conductive ball (e.g., a solder ball, a solder in which a core ball is provided, or the like)) or a conductive post (e.g., Cu post, or the like) is formed respectively. The internal connection pads 34 electrically connect a semiconductor device 20, which is loaded on the semiconductor device 10, and the semiconductor device 10 via the internal connection terminals 18. As the internal connection pad 34, for example, the patterned metal film (concretely, e.g., Cu film) can be used. When the Cu film is used as the internal connection pad 34, for example, a Ni/Au laminated film laminated in a order of a Ni layer and an Au layer may be provided on the internal connection pad 34.

Next, a configuration of the semiconductor device 20 mounted on the semiconductor device 10 will be explained hereunder. The semiconductor device 20 has a wiring substrate 21 (another wiring substrate) having pads 22, 23 and internal connection pads 25, and electronic components 27, 28. The pads 22, 23 are provided on an upper surface side of the wiring substrate 21. The pads 22 are connected to the electronic component 27. The pads 23 are connected to the electronic component 28. The pads 22, 23 are electrically connected to the internal connection pads 25.

The internal connection pads 25 are provided on the lower surface of the wiring substrate 21 (surface of the wiring substrate 21 opposing to the semiconductor device 10). The internal connection pads 25 are electrically connected to the semiconductor device 10 via the internal connection terminals 18. As the wiring substrate 21, for example, a coreless substrate, a build-up substrate with core, or the like can be employed. The electronic component 27 is mounted on the pads 22. As the electronic component 27, for example, a semiconductor element can be used. The electronic component 28 is mounted on the pads 23. As the electronic component 28, for example, a chip resistor, a chip capacitor, a chip inductor, or the like can be employed. In this case, another semiconductor device constructed similarly to the semiconductor device 10 may be stacked on the semiconductor device 10.

The solder resist 35 is provided on the upper surface 31A of the wiring substrate main body 31. The solder resist 35 has the opening portion 43 that is shaped to have the substantially same size (area) as the semiconductor element mounting area A when viewed from the top, and the opening portions 44 that exposes the upper surfaces of the internal connection pads 34 respectively. The opening portion 43 exposes the portion of the wiring pattern 33 corresponding to the semiconductor element mounting area A prior to a state that the underfill resin 13 is formed. When thicknesses of the wiring pattern 33 and the internal connection pads 34 are 15 μm respectively, a thickness of the solder resist 35 on the wiring pattern 33 and the internal connection pads 34 can be set to 10 μm, for example. The solder resist 35 can be formed by the printing method, for example.

The dam 37 is provided on an upper surface 35A of the solder resist 35 so as to surround the semiconductor element mounting area A. The dam 37 prevents the underfill resin 13 from flowing out on the internal connection pads 34 (to block the underfill resin 13) when the underfill resin 13 provided in the clearance between the wiring substrate 11 and the semiconductor element 12 is formed.

A groove portion 45 is formed between a side surface 12-1 of the semiconductor device 12 that is shaped into a quadrangle when viewed from the top, and an inner wall of a portion of the dam 37 opposing to the side surface 12-1 of the semiconductor device 12. A part of this groove portion 45 corresponds to an underfill resin feeding area B from which the underfill resin 13 is fed. A distance $D_1$ (first distance) is defined between the inner wall of the portion of the dam 37 opposing to the side surface 12-1 of the semiconductor device 12 and the side wall of the portion of the solder resist 35 corresponding to the side surface of the opening portion 43. This distance $D_1$ is set to a distance over which an underfill resin feeding nozzle (not shown) can feed the underfill resin 13 to the groove portion 45 when the underfill resin 13 is formed. Concretely, the distance $D_1$ can be set to 0.7 mm to 2.5 mm, for example.

Similarly, a groove portion 46 is formed between a side surface 12-2 of the semiconductor device 12 that is shaped into a quadrangle when viewed from the top, and an inner wall of a portion of the dam 37 opposing to the side surface 12-2 of the semiconductor device 12. A part of this groove portion 46 corresponds to the underfill resin feeding area B from which the underfill resin 13 is fed. A distance $D_2$ (first distance) is defined between the inner wall of the portion of the dam 37 opposing to the side surface 12-2 of the semiconductor device 12 and the side wall of the portion of the solder resist 35 corresponding to the side surface of the opening portion 43. This distance $D_2$ is set to a distance over which the underfill resin feeding nozzle (not shown) can feed the underfill resin 13 to the groove portion 46 when the underfill resin 13 is formed. The distance $D_2$ is set to a distance that is substantially equal to the distance $D_1$. Concretely, the distance $D_2$ can be set to 0.7 mm to 2.5 mm, for example.

A groove portion 47 is formed between a side surface 12-3 of the semiconductor device 12 that is shaped into a quadrangle when viewed from the top, and an inner wall of a portion of the dam 37 opposing to the side surface 12-3 of the semiconductor device 12. This groove portion 47 has a first groove portion 48 and a second groove portion 49.

The first groove portion 48 is formed such that a width of the first groove portion 48 is narrowed continuously as a position goes from a corner 12B of the semiconductor device 12 toward a corner 12C of the semiconductor device 12. The corner 12B is defined between the side surface 12-2 of the semiconductor device 12 and the side surface 12-3 of the semiconductor device 12. The corner 12C is defined between the side surface 12-3 of the semiconductor device 12 and a side surface 12-4 of the semiconductor device 12.

In other words, a part of the inner wall of the portion of the dam 37 constituting the first groove portion 48 is formed like such a taper shape, when viewed from the top, that the inner wall approaches to the side surface 12-3 of the semiconductor device 12 from the corner 12B to the corner 12C.

Thus, distance (second distance) between the inner wall of the portion of the dam 37 constituting the first groove portion 48 and the side wall of the portion of the solder resist 35 corresponding to the side surface of the opening portion 43 is made continuously smaller. Concretely, within the first groove portion 47, a distance $D_3$ of the portion which is largest can be set to 0.7 mm to 2.5 mm, for example, and a distance $D_4$ of the portion which is smallest can be set to 0.2 mm, for example.

The second groove portion 49 is integrated with the first groove portion 48. A width of the second groove portion 49 is narrower than widths of the groove portions 45, 46, is substantially constant. A distance $D_5$ (second distance) is defined between the inner wall of the portion of the dam 37 constituting the second groove portion 49 and the side wall of the portion of the solder resist 35 corresponding to the side surface of the opening portion 43. This distance $D_5$ can be set to 0.2 mm, for example.

Similar to the groove portion 47, a groove portion 51 is defined between the side surface 12-4 of the semiconductor device 12 that is shaped into a quadrangle when viewed from the top, and the inner wall of the portion of the dam 37 opposing to the side surface 12-4 of the semiconductor device 12. This groove portion 51 has a first groove portion 52 and a second groove portion 53.

Similarly to the first groove portion 48 of the groove portion 47, the first groove portion 52 is constructed such that a groove width of the first groove portion 52 is narrowed continuously as a position goes from a corner 12D of the semiconductor device 12 toward the corner 12C of the semiconductor device 12. The corner 12D is defined between the side surface 12-1 of the semiconductor device 12 and the side surface 12-4 of the semiconductor device 12. The corner 12C is defined between the side surface 12-3 of the semiconductor device 12 and the side surface 12-4 of the semiconductor device 12.

In other words, the inner wall of the portion of the dam 37 constituting the first groove portion 52 is formed like such a taper shape, when viewed from the top, that the inner wall comes close to the side surface 12-4 of the semiconductor device 12 from the corner 12D to the corner 12C.

Thus, distance (second distance) between the inner wall of the portion of the dam 37 constituting the first groove portion 52 and the side wall of the portion of the solder resist 35 corresponding to the side surface of the opening portion 43 is made continuously smaller. Concretely, within the groove first groove portion 52, a distance $D_6$ of the portion which is largest can be set to 0.7 mm to 2.5 mm, for example, and a distance $D_7$ of the portion which is smallest can be set to 0.2 mm, for example.

The second groove portion 53 is integrated with the first groove portion 52. A width of the second groove portion 53 is narrower than widths of the groove portions 45, 46, and is substantially constant. A distance $D_8$ (second distance) is defined between the inner wall of the portion of the dam 37 constituting the second groove portion 53 and the side wall of the portion of the solder resist 35 corresponding to the side surface of the opening portion 43. This distance $D_8$ can be set to 0.2 mm, for example.

The dam 37 constructed has a shape such that the distance between the side wall of the portion of the solder resist 35 corresponding to the side surface of the opening portion 43 and the inner wall of the dam 37 is partially varied. A height of the dam 37 can be set to 20 μm, for example. Also, as the material of the dam 37, the solder resist can be employed, for example. When the solder resist is employed as the material of the dam 37, the dam 37 can be formed by the screen printing method, for example.

In this manner, distances $D_1$, $D_2$ (first distance) between the side wall of the portion of the solder resist 35 corresponding to the underfill resin feeding area B and the inner wall of the dam 37 is set smaller than distances $D_5$, $D_8$ (second distance) from the side wall of the portion of the solder resist 35 not corresponding to the underfill resin feeding area B to the inner wall of the dam 37. In other words, the distance between the inner wall of the opening portion 43 of the solder resist 35 and the inner wall of the dam 37 is partially varied.

Therefore, when forming the underfill resin 13 in the clearance between the wiring substrate 11 and the semiconductor element 12 that is flip-chip bonded to the wiring substrate 11, the flowing direction of the fed underfill resin 13 can be controlled by the inner wall of the dam 37 such that the underfill resin 13 is directed to the clearance between the semiconductor element 12 and the wiring substrate 11 and sufficiently reaches to the corner 12C which is opposing corner of the corner 12A where the underfill resin feeding area B is formed. As a result, the portion of the wiring pattern 33 exposed from the opening portion 43 can be covered with the underfill resin 13 with good precision, and thus reliability of the wiring pattern 33 to which the semiconductor element 12 is flip-chip bonded can be improved.

Also, distance (second distance) between the inner wall of the portion of the dam 37 constituting the first groove portions 48, 52 and the side wall of the portion of the solder resist 35 corresponding to the side surface of the opening portion 43 is made continuously smaller. Therefore, the flowing direction of the underfill resin 13 can be controlled such that the underfill resin 13 is directed to an area of the wiring pattern 33, which is located near the corner 12C of the semiconductor element 12 (a corner positioned on the opposite side to a corner 12A between the side surface 12-1 of the semiconductor element 12 and the side surface 12-2 of the semiconductor element 12) and in which it was difficult to form the underfill resin 13 in the related art. As a result, reliability of the wiring pattern 33 can be further improved.

The external connection pads 38 are provided on a lower surface 31B of the wiring substrate main body 31. The external connection pads 38 are electrically connected to the wiring pattern 33 and the internal connection pads 34 via vias and wiring (not shown) provided in the wiring substrate main body 31. The external connection pads 38 used to provide the external connection terminal 14 respectively. As the external connection pads 38, for example, the patterned metal film (e.g., Cu film) can be employed.

According to the wiring substrate of the present embodiment, distances $D_1$, $D_2$ (first distance) between the side wall of the portion of the solder resist 35 corresponding to the underfill resin feeding area B and the inner wall of the dam 37 is set smaller than distances $D_5$, $D_8$ (second distance) between the side wall of the portion of the solder resist 35 not corresponding to the underfill resin feeding area B and the inner wall of the dam 37 (distance between the inner wall of the opening 43 of the solder resist 35 and the inner wall of the dam 37 is partially varied). Therefore, when forming the underfill resin 13 in the clearance between the wiring substrate 11 and the semiconductor element 12 that is flip-chip bonded to the wiring substrate 11, the flowing direction of the underfill resin 13 can be controlled by the inner wall of the dam 37 such that the underfill resin 13 is directed to the clearance between the semiconductor element 12 and the wiring substrate 11. As a result, the portion of the wiring pattern 33 exposed from the opening portion 43 can be covered with the underfill resin 13 with good precision, and thus reliability of the wiring pattern 33 to which the semiconductor element 12 is flip-chip bonded can be improved.

Also, distance (second distance) between the inner wall of the portion of the dam 37 constituting the first groove portions 48, 52 and the side wall of the portion of the solder resist 35 corresponding to the side surface of the opening portion 43 is made continuously smaller. Therefore, the flowing direction of the underfill resin 13 can be controlled such that the underfill resin 13 is directed to an area of the wiring pattern 33, which is located near the corner 12C of the semiconductor element 12 (a corner positioned on the opposite side to a corner 12A between the side surface 12-1 of the semiconductor element 12 and the side surface 12-2 of the semiconductor element 12) and in which it was difficult to form the underfill resin 13 in the related art. As a result, reliability of the wiring pattern 33 can be further improved. In particular, the above configuration is effective for the case where an outer shape size of the semiconductor element 12 when viewed from the top is large (the case where an outer shape size of the semiconductor element 12 when viewed from the top is more than 10 mm square).

The semiconductor element 12 has the electrode pads 56 on which the bumps 16 are provided. The semiconductor element 12 is flip-chip bonded to the connection portions 41 of the wiring pattern 33. The semiconductor element 12 is electrically connected to the wiring substrate 11 via the bumps 16. An outer shape size of the semiconductor element 12 when viewed from the top is more than 10 mm square, for example. The bumps 16 are fixed to the connection portions 41 by a solder. As the bumps 16, for example, a solder bump, an Au bump, or the like can be employed.

The underfill resin 13 is provided so as to fill the clearance between the wiring substrate 11 and the semiconductor element 12 that is flip-chip bonded to the wiring substrate 11. The underfill resin 13 covers the portion of the wiring pattern 33 exposed from the opening portion 43 and seals the bumps 16. The underfill resin 13 is fed to the clearance between the wiring substrate 11 and the semiconductor element 12 through portions of the groove portions 45, 46 corresponding to the underfill resin feeding area B. At this time, an underfill resin feeding nozzle (not shown) is arranged to oppose to the portions of the groove portions 45, 46 corresponding to the underfill resin feeding area B, and then the resin serving as the underfill resin 13 is fed while moving the underfill resin feeding nozzle (not shown) as shown in allows C. As the material of the underfill resin 13, for example, an epoxy resin can be employed.

The external connection terminals 14 are provided on the lower surfaces of the external connection pads 38 respectively. The external connection terminals 14 connect (mount) the semiconductor device 10 to the pads (not shown) of the mounting substrate such as the mother board, or the like. As the external connection terminal 14, for example, a solder ball can be employed.

According to the semiconductor device of the present embodiment, distances $D_1$, $D_2$ (first distance) between the side wall of the portion of the solder resist 35 corresponding to the underfill resin feeding area B and the inner wall of the dam 37 is set smaller than distances $D_5$, $D_8$ (second distance) between the side wall of the portion of the solder resist 35 not corresponding to the underfill resin feeding area B and the inner wall of the dam 37. That is, distance between the inner wall of the opening portion 43 of the solder resist 35 and the inner wall of the dam 37 is partially varied. Therefore, when forming the underfill resin 13 in the clearance between the wiring substrate 11 and the semiconductor element 12 that is flip-chip bonded to the wiring substrate 11, the flowing direction of the underfill resin 13 can be controlled by the inner wall of the dam 37 such that the underfill resin 13 is directed to the clearance between the semiconductor element 12 and the wiring substrate 11. As a result, the portion of the wiring pattern 33 exposed from the opening portion 43 can be covered with the underfill resin 13 with good precision, and thus reliability of the wiring pattern 33 to which the semiconductor element 12 is flip-chip bonded can be improved.

Also, distance (second distance) between the inner wall of the portion of the dam 37 constituting the first groove portions 48, 52 and the side wall of the portion of the solder resist 35 corresponding to the side surface of the opening portion 43 is made continuously smaller. Therefore, the flowing direction of the underfill resin 13 can be controlled such that the underfill resin 13 is directed to an area of the wiring pattern 33, which is located near the corner 12C of the semiconductor element 12 (a corner positioned on the opposite side to a corner 12A between the side surface 12-1 of the semiconductor element 12 and the side surface 12-2 of the semiconductor element 12) and in which it was difficult to form the underfill resin 13 in the related art. As a result, reliability of the wiring pattern 33 can be further improved. In particular, the above configuration is effective for the case where an outer shape size of the semiconductor element 12 when viewed from the top is large (the case where an outer shape size of the semiconductor element 12 when viewed from the top is more than 10 mm square).

Figure 7:
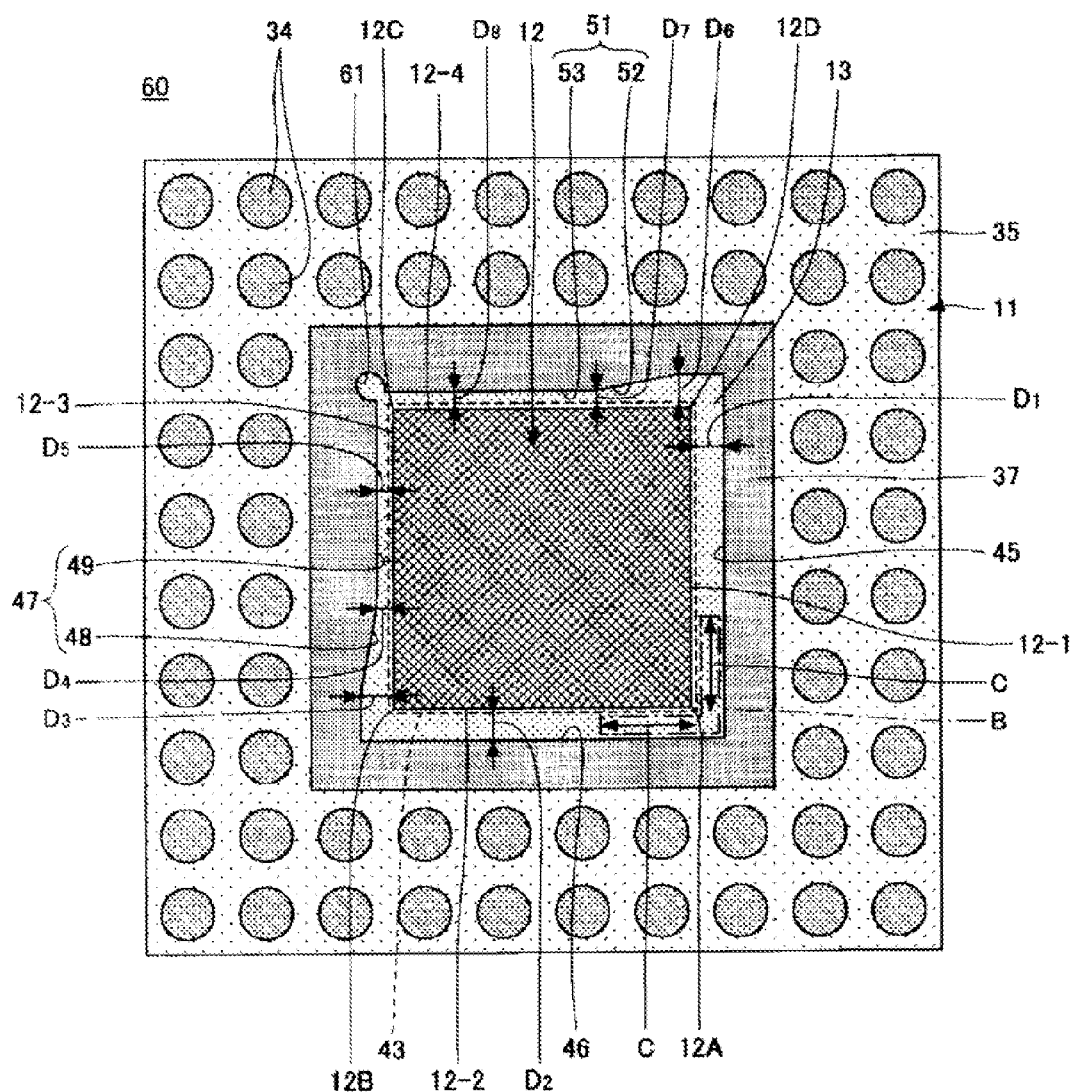
FIG. 7 is a plan view of a semiconductor device according to a modification of the first embodiment of the present invention.

FIG. 7 is a plan view of a semiconductor device according to a modification of the first embodiment of the present invention. In FIG. 7, the same reference symbols are affixed to the same constituent portions as those of the semiconductor device 10 in the first embodiment.

By reference to FIG. 7, a semiconductor device 60 according to a modification of the first embodiment is similar to the semiconductor device 10, except that a notched portion 61 is provided on the dam 37 provided on the semiconductor device 10 in the first embodiment.

The notched portion 61 is formed on the inner wall of the portion of the dam 37 opposing to the corner 12C of the semiconductor element 12, which is positioned on the opposite side to the corner 12A of the semiconductor element 12 opposing to the underfill resin feeding area B.

In this manner, the notched portion 61 is formed on the inner wall of the portion of the dam 37 opposing to the corner 12C of the semiconductor element 12, which is positioned on the opposite side to the corner 12A of the semiconductor element 12 opposing to the underfill resin feeding area B. Therefore, when the underfill resin 13 is formed in the clearance between the semiconductor element 12 and the wiring substrate 11, the extra underfill resin 13 can be stored in the notched portion 61. As a result, such a situation can be prevented that the extra underfill resin 13 gets over the dam 37 and flows out onto the internal connection pads 34.

In this case, the semiconductor device 60 according to the modification of the first embodiment can achieve the similar advantages as those of the semiconductor device 10 in the first embodiment.

(Second Embodiment)

Figure 8:
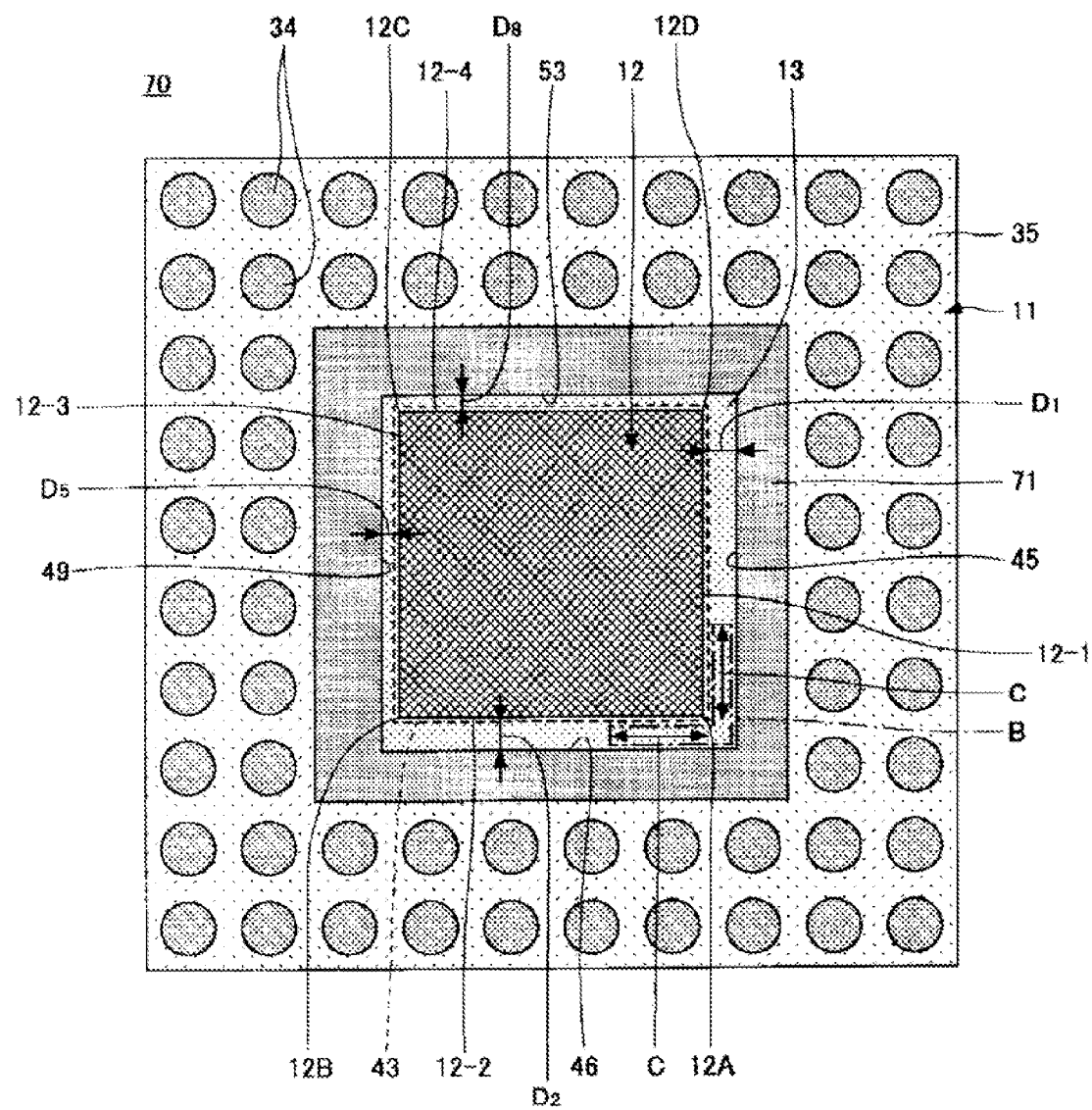
FIG. 8 is a plan view of a semiconductor device according to a second embodiment of the present invention.

FIG. 8 is a plan view of a semiconductor device according to a second embodiment of the present invention. In FIG. 8, the same reference symbols are affixed to the same constituent portions as those of the semiconductor device 10 in the first embodiment.

By reference to FIG. 8, a semiconductor device 70 according to the second embodiment is similar to the semiconductor device 10, except that a dam 71 is provided instead of the dam 37 provided on the semiconductor device 10 in the first embodiment.

The dam 71 is similar to the dam 37, except that a shape of the portion of the dam 37 (see FIG. 5) forming the first groove portions 48, 52 is modified into the shape constituting the second groove portions 49, 53 explained in the first embodiment. That is, the semiconductor device 70 does not have the first groove portions 48, 52 whose groove width is narrowed continuously.

In this case, the semiconductor device 70 according to the second embodiment can achieve the similar advantages as those of the semiconductor device 10 in the first embodiment, too.

(Third Embodiment)

Figure 9:
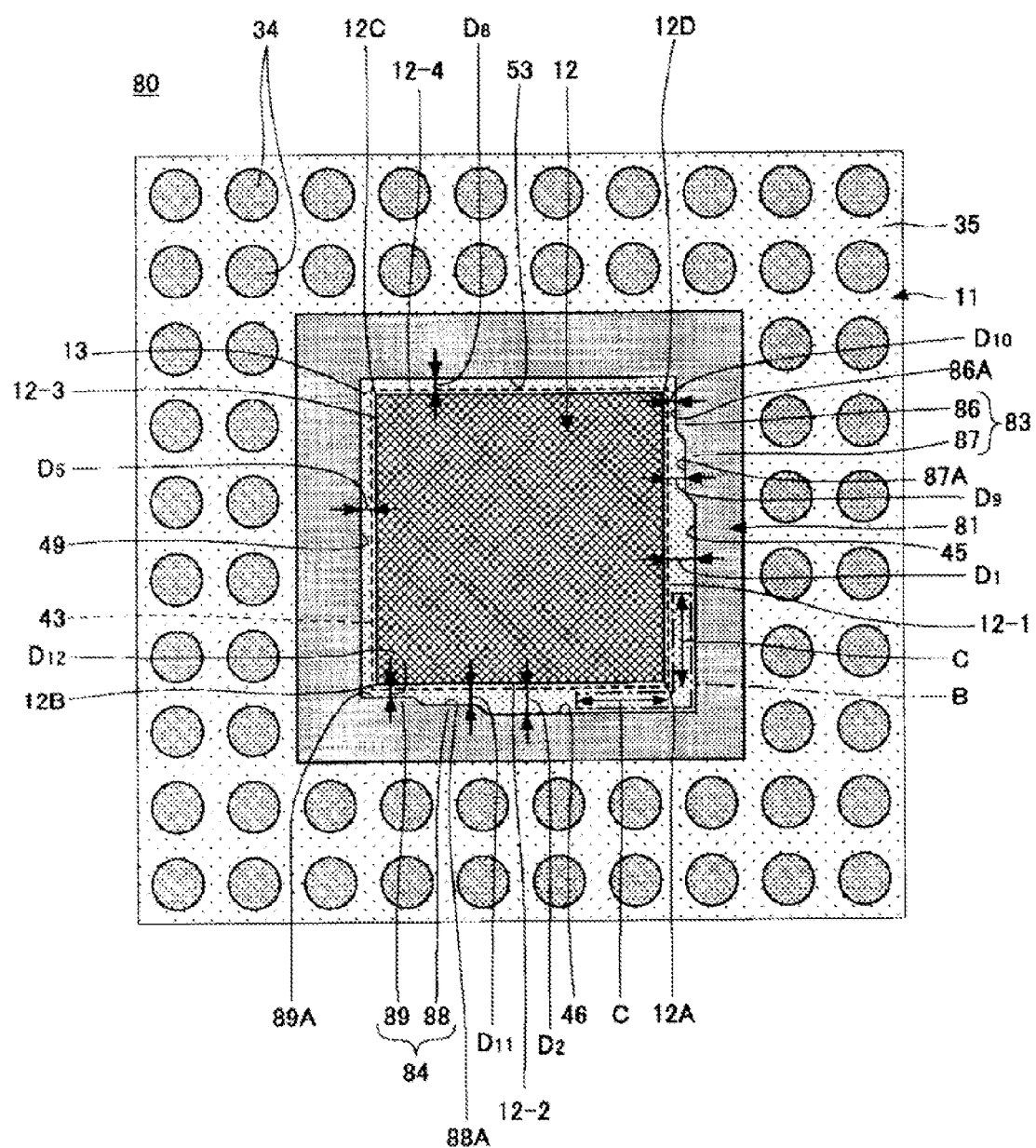
FIG. 9 is a plan view of a semiconductor device according to a third embodiment of the present invention.

FIG. 9 is a plan view of a semiconductor device according to a third embodiment of the present invention. In FIG. 9, the same reference symbols are affixed to the same constituent portions as those of the semiconductor device 70 in the second embodiment.

By reference to FIG. 9, a semiconductor device 80 according to the third embodiment is similar to the semiconductor device 70, except that a dam 81 is provided instead of the dam 71 provided on the semiconductor device 70 in the second embodiment.

The dam 81 is similar to the dam 71 (see FIG. 8), except that a projection portion 83 and a projection portion 84 are provided. The projection portion 83 is provided on the portion that is positioned near the corner 12B and opposes to the side surface of the semiconductor element 12. The projection portion 84 is provided on the portion that is positioned near the corner 12D and opposes to the side surface of the semiconductor element 12.

The projection portion 83 has a first projection portion 86 and a second projection portion 87. The first projection portion 86 is provided more closely to the corner 12A side of the semiconductor element 12 than the second projection portion 87. Distance $D_9$ (second distance) between a side surface 86A of the first projection portion 86 and the side wall of the portion of the solder resist 35 corresponding to the side surface of the opening portion 43 is set smaller than distance $D_1$ (first distance). Concretely, when the distance $D_1$ is 1 mm, the distance $D_9$ can be set to 0.5 mm, for example.

The second projection portion 87 is provided more closely to the corner 12D side of the semiconductor element 12 than the first projection portion 86. The second projection portion 87 is made integral with the first projection portion 86. Distance $D_{10}$ (second distance) between a side surface 87A of the second projection portion 87 and the side wall of the portion of the solder resist 35 corresponding to the side surface of the opening portion 43 is set smaller than distance $D_1$ (first distance). Concretely, when the distance $D_1$ is 1 mm, the distance $D_{10}$ can be set to 0.2 mm, for example.

The projection portion 83 is provided to stepwisely reduce distances $D_9$, $D_{10}$ (second distances) between the side surfaces 86A, 87A of the projection portion 83 and the side wall of the portion of the solder resist 35 corresponding to the side surface of the opening portion 43.

The projection portion 84 has a first projection portion 88 and a second projection portion 89. The first projection portion 88 is provided more closely to the corner 12A side of the semiconductor element 12 than the second projection portion 89. Distance $D_{11}$ (second distance) between a side surface 88A of the first projection portion 88 and the side wall of the portion of the solder resist 35 corresponding to the side surface of the opening portion 43 is set smaller than distance $D_2$ (first distance). Concretely, when the distance $D_2$ is 1 mm, the distance $D_{11}$ can be set to 0.5 mm, for example.

The second projection portion 89 is provided more closely to the corner 12B side of the semiconductor element 12 than the first projection portion 88. The second projection portion 89 is made integral with the first projection portion 88. Distance $D_{12}$ (second distance) between a side surface 89A of the second projection portion 89 and the side wall of the portion of the solder resist 35 corresponding to the side surface of the opening portion 43 is set smaller than distance $D_2$ (first distance). Concretely, when the distance $D_2$ is 1 mm, the distance $D_{12}$ can be set to 0.2 mm, for example.

The projection portion 84 is provided to stepwisely reduce distances $D_{11}$, $D_{12}$ (second distances) between the side surfaces 88A, 89A of the projection portion 84 and the side wall of the portion of the solder resist 35 corresponding to the side surface of the opening portion 43.

According to the semiconductor device of the present embodiment, controlling performance of the flowing direction of the underfill resin 13 can be improved by providing the projection portions 83, 84 to the dam 81. Therefore, the wiring pattern 33 can be covered with the underfill resin 13 with high precision, and thus reliability of the wiring pattern 33 can be further improved.

Also, the semiconductor device 80 according to the present embodiment can achieve the similar advantages as those of the semiconductor device 70 in the second embodiment.

(Fourth Embodiment)

Figure 10:
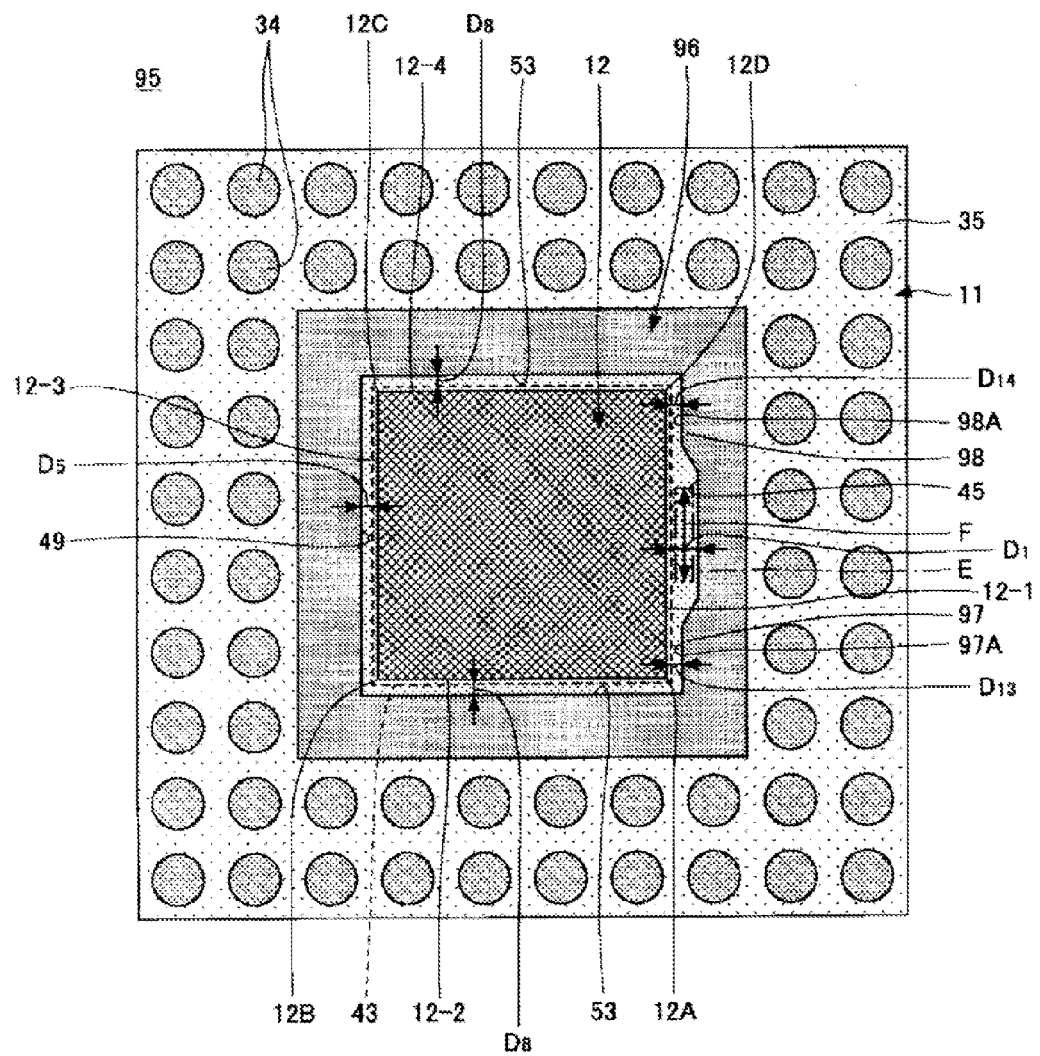
FIG. 10 is a plan view of a semiconductor device according to a fourth embodiment of the present invention.

FIG. 10 is a plan view of a semiconductor device according to a fourth embodiment of the present invention. In FIG. 10, a reference symbol E denotes an area which is provided between the semiconductor element 12 and the wiring substrate 11 and to which the underfill resin 13 is fed (referred to as an "underfill resin feeding area E" hereinafter). Also, in FIG. 10, the same reference symbols are affixed to the same constituent portions as those of the semiconductor device 70 in the second embodiment.

By reference to FIG. 10, a semiconductor device 95 according to the fourth embodiment is similar to the semiconductor device 70, except that a dam 96 is provided instead of the dam 71 provided on the semiconductor device 70 in the second embodiment.

The dam 96 is similar to the dam 71, except that an inner wall of the portion of the dam 96 opposing to the side surface 12-2 of the semiconductor element 12 is positioned closer to the side surface 12-2 of the semiconductor element 12 such that the groove portion 53 provided in the dam 71 is formed instead of the groove portion 46 provided in the dam 71 (see FIG. 8), a projection portion 97 is provided on the portion that is positioned near the corner 12A and opposes to the side surface 12-4 of the semiconductor element 12, and a projection portion 98 is provided on the portion that is positioned near the corner 12D and opposes to the side surface 12-4 of the semiconductor element 12.

The projection portion 97 makes distance $D_{13}$ (second distance) between the side wall of the portion of the solder resist 35 corresponding to areas except the underfill resin feeding area E and an inner wall 97A of the projection portion 97 smaller than the distance $D_1$ (first distance). Concretely, when the distance $D_1$ is 1 mm, the distance $D_{13}$ can be set to 0.2 mm, for example. A side wall of the portion of the projection portion 97 opposing to the projection portion 98 is formed like a taper shape, when viewed from the top, to guide the underfill resin 13 to a clearance between the semiconductor element 12 and the wiring substrate 11.

The projection portion 98 makes distance $D_{14}$ (second distance) between the side wall of the portion of the solder resist 35 corresponding to areas except the underfill resin feeding area E and an inner wall 98A of the projection portion 98 smaller than the distance $D_1$ (first distance). Concretely, when the distance $D_1$ is 1 mm, the distance $D_{14}$ can be set to 0.2 mm, for example. A side wall of the portion of the projection portion 98 opposing to the projection portion 97 is formed like a taper shape, when viewed from the top, to guide the underfill resin 13 to a clearance between the semiconductor element 12 and the wiring substrate 11.

In this case, the semiconductor device 95 according to the fourth embodiment can achieve the similar advantages as those of the semiconductor device 70 in the second embodiment.

(Fifth Embodiment)

Figure 11:
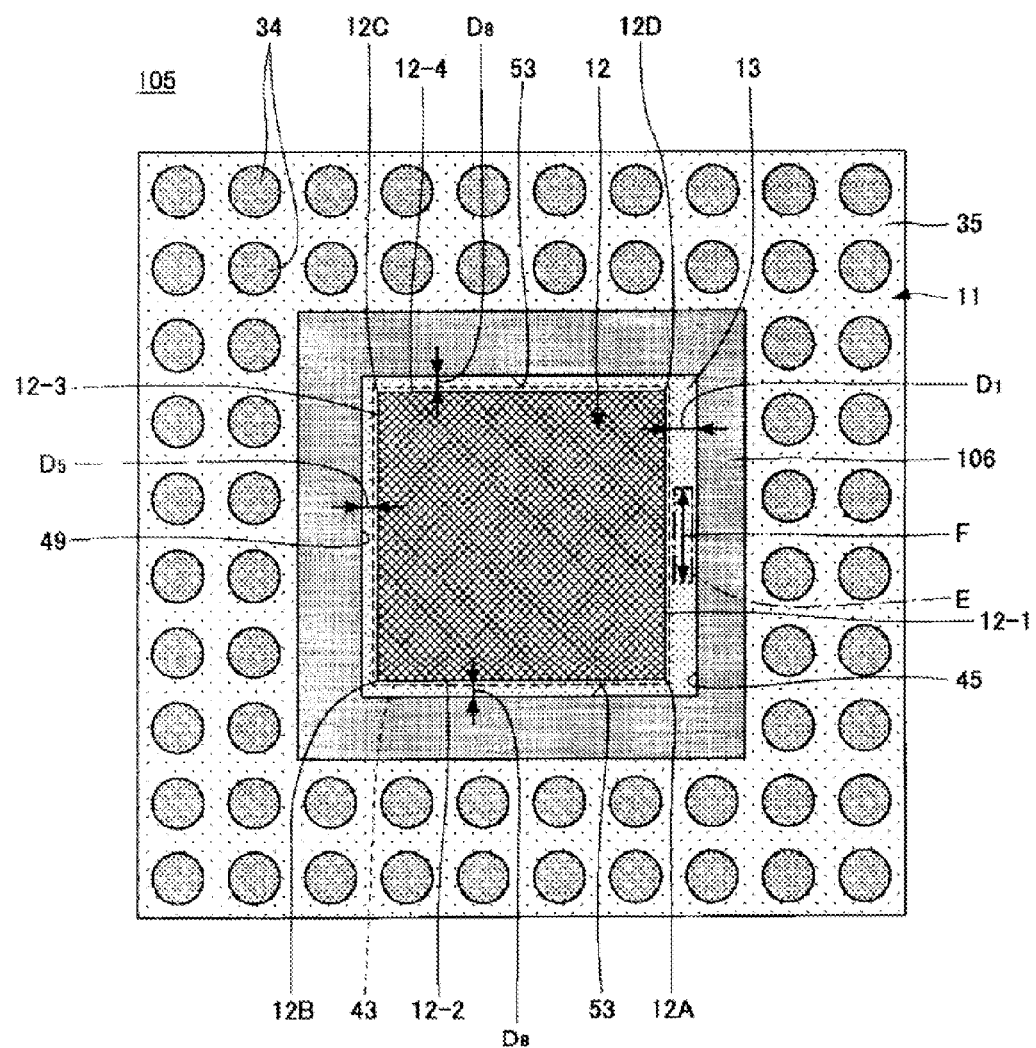
FIG. 11 is a plan view of a semiconductor device according to a fifth embodiment of the present invention.

FIG. 11 is a plan view of a semiconductor device according to a fifth embodiment of the present invention. In FIG. 11, the same reference symbols are affixed to the same constituent portions as those of the semiconductor device 95 in the fourth embodiment.

By reference to FIG. 11, a semiconductor device 105 according to the fifth embodiment is similar to the semiconductor device 95, except that a dam 106 is provided instead of the dam 96 provided on the semiconductor device 95 in the fourth embodiment.

The dam 106 is similar to the dam 96, except that the projection portions 97, 98 provided on the dam 96 (see FIG. 10) are removed from the constituent elements.

In this case, the semiconductor device 105 according to the fifth embodiment can achieve the similar advantages as those of the semiconductor device 95 in the fourth embodiment.

(Sixth Embodiment)

Figure 12:
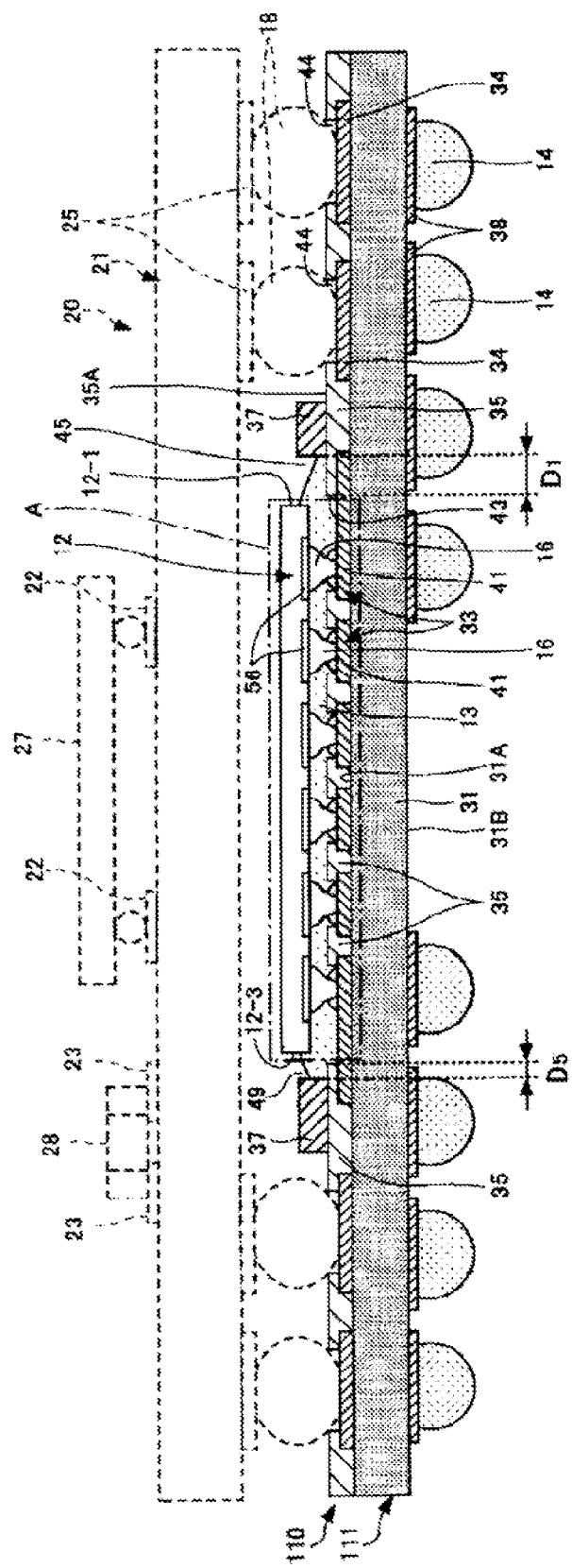
FIG. 12 is a plan view of a semiconductor device according to a sixth embodiment of the present invention.

FIG. 12 is a plan view of a semiconductor device according to a sixth embodiment of the present invention. In FIG. 12, the same reference symbols are affixed to the same constituent portions as those of the semiconductor device 10 in the first embodiment.

By reference to FIG. 12, a semiconductor device 110 according to the sixth embodiment is similar to the semiconductor device 10, except that the solder resist 35 is provided on the configuration of the semiconductor device 10 in the first embodiment to cover the portion of the wiring pattern 33 corresponding to the semiconductor element mounting area A except the connection portions 41.

In this manner, the solder resist 35 is provided so as to cover the portion of the wiring pattern 33 corresponding to the semiconductor element mounting area A except the connection portions 41. Therefore, a flow rate of the underfill resin 13 flowing through the clearance between the semiconductor element 12 and the wiring substrate 11 can be increased.

In this case, the semiconductor device 110 according to the sixth embodiment can achieve the similar advantages as those of the semiconductor device 10 in the first embodiment.

Also, the dam 71, 81, 96, 106 explained in the second to fifth embodiments may be provided in place of the dam 37 provided on the semiconductor device 110. Also, the notched portion 61 shown in FIG. 7 may be provided on the dam 37, 71, 81, 96, 106 provided on the semiconductor device 110.

(Seventh Embodiment)

Figure 13:
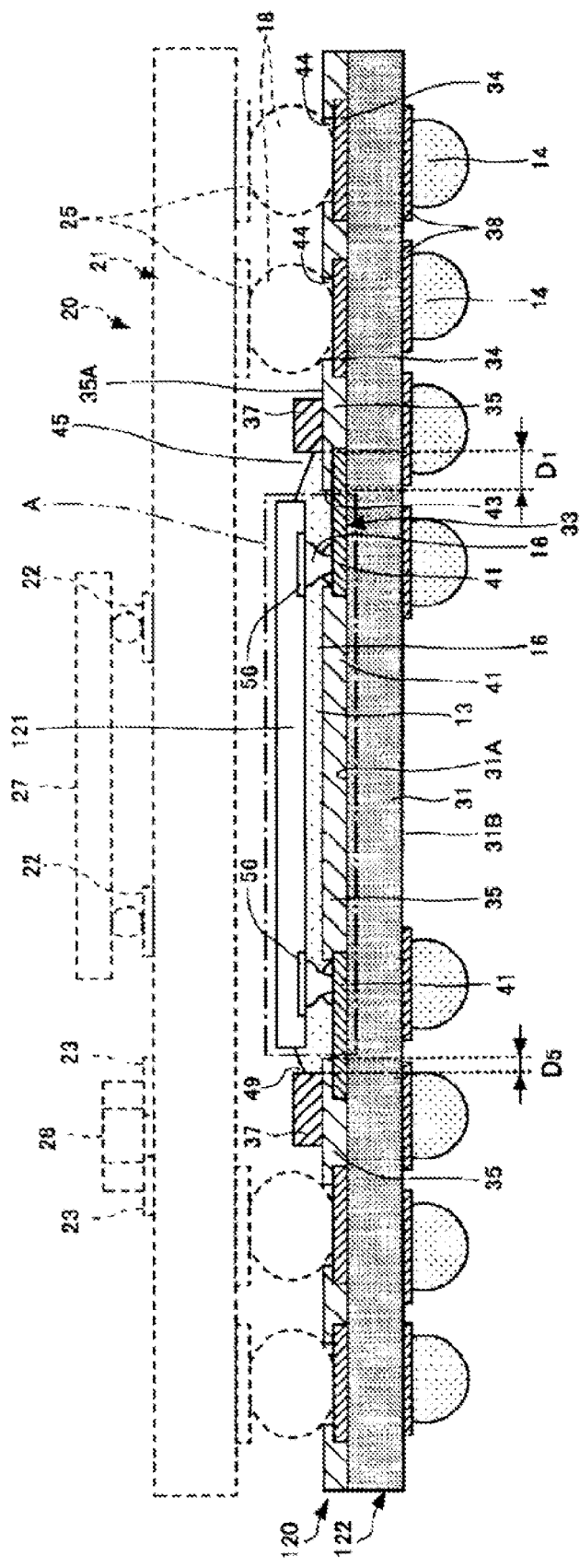
FIG. 13 is a plan view of a semiconductor device according to a seventh embodiment of the present invention.

FIG. 13 is a plan view of a semiconductor device according to a seventh embodiment of the present invention. In FIG. 13, the same reference symbols are affixed to the same constituent portions as those of the semiconductor device 10 in the first embodiment.

By reference to FIG. 13, a semiconductor device 120 according to the seventh embodiment is similar to the semiconductor device 10, except that a semiconductor element 121 in which the electrode pads 56 are arranged as peripheral electrodes and a wiring substrate 122 are provided instead of the semiconductor element 12 and the wiring substrate 11 provided on the semiconductor device 10 of the first embodiment.

The wiring substrate 122 is similar to the wiring substrate 11 (see FIG. 6), except that the connection portions 41 are arranged on the upper surface 31A of the portion of the wiring substrate main body 31 opposing to the electrode pads 56 provided on the semiconductor element 121.

In this fashion, even when the dam 37 explained in the first embodiment is provided on the semiconductor device 120 having the semiconductor element 121 in which the electrode pads 56 are arranged as peripheral electrodes, the similar advantages to those of the semiconductor device 10 in the first embodiment can be achieved.

Also, the dam 71, 81, 96, 106 explained in the second to fifth embodiments may be provided in place of the dam 37 provided on the semiconductor device 120. Also, the notched portion 61 shown in FIG. 7 may be provided on the dam 37, 71, 81, 96, 106 provided on the semiconductor device 120.

With the above, the preferred embodiments of the present invention are described in detail. But the present invention is not limited to the particular embodiments. Various variations and modifications can be applied within a range of a gist of the invention set forth in claims.

For example, the dam 37, 71, 81, 96, 106 explained in the first to fifth embodiments may be provided on the semiconductor device having the wiring substrate to which the internal connection pad 34 is not provided.

The present invention is applicable to the wiring substrate including the wiring substrate main body, the wiring pattern having connection portions to which the semiconductor element is flip-chip bonded, the solder resist from which the connection portions are exposed, and the dam provided on the solder resist and provided in the clearance between the semiconductor element and the wiring substrate main body to block the underfill resin, and the semiconductor device using the same.

While the invention has been described in connection with the exemplary embodiments, it will be obvious to those skilled in the art that various changes and modifications may be made therein without departing from the present invention, and it is aimed, therefore, to cover in the appended claim all such changes and modifications as fall within the true spirit and scope of the present invention.

What is claimed is:
1. A wiring substrate, comprising:
a wiring substrate main body having a semiconductor element mounting area in which a semiconductor element is mounted;
a wiring pattern provided on a first surface of the wiring substrate main body at a portion corresponding to the semiconductor element mounting area, and having connection portions to which the semiconductor element is flip-chip bonded;
a solder resist provided on the first surface of the wiring substrate main body, and an inner wall of the solder resist defining an opening portion whose size is substantially equal to the semiconductor element mounting area, when viewed from a top; and
a dam provided on an upper surface of the solder resist so as to surround the semiconductor element mounting area, for blocking an underfill resin provided in a clearance between the semiconductor element and the wiring substrate main body,
wherein
a distance between the inner wall of the solder resist defining the opening portion and an inner wall of the dam is varied,
an underfill resin feeding area, from which the underfill resin is fed, is defined at a portion of a clearance between the semiconductor element and the wiring substrate main body,
a first distance is defined between the inner wall of the opening portion of the solder resist and the inner wall of the dam in the underfill resin feeding area,
a second distance is defined between the inner wall of the opening portion of the solder resist and the inner wall of the dam in an area other than the underfill resin feeding area,
the first distance is larger than the second distance, and the inner wall of the dam is formed such that the distance between the inner wall of the opening portion of the solder resist and the inner wall of the dam decreases stepwisely or continuously from the first distance to the second distance.

2. The wiring substrate according to claim 1, wherein the distance between the inner wall of the solder resist defining the opening portion and the inner wall of the dam decreases stepwisely or continuously from the first distance to the second distance as a distance from the underfill resin feeding area increases.

3. The wiring substrate according to claim 1, wherein the inner wall of the solder resist defines a quadrangular shape so as to provide the opening portion with a quadrangular shape, and the underfill resin feeding area is provided at a corner of the quadrangular-shaped inner wall of the solder resist such that the first distance is defined between the inner wall of the solder resist and the inner wall of the dam at said corner.

4. The wiring substrate according to claim 3, wherein the distance between the inner wall of the solder resist and the inner wall of the dam decreases from the first distance at said corner to the second distance at each of a pair of adjacent corners.

5. The wiring substrate according to claim 3, wherein the distance between the inner wall of the solder resist and the inner wall of the dam decreases stepwisely from the first distance at said corner to the second distance at each of a pair of adjacent corners.

6. The wiring substrate according to claim 5, wherein the distance between the inner wall of the solder resist and the inner wall of the dam is the first distance at a corner opposite to the corner at which the underfill resin feeding area is provided.

7. The wiring substrate according to claim 3, wherein the distance between the inner wall of the solder resist and the inner wall of the dam is the first distance for two adjacent sides of the quadrangular-shaped inner wall of the solder resist which intersect at the corner at which the underfill resin feeding area is provided.

8. The wiring substrate according to claim 7, wherein the distance between the inner wall of the solder resist and the inner wall of the dam decreases from the first distance to the second distance at each of two adjacent sides of the quadrangular-shaped inner wall of the solder resist which intersect at a corner opposite to the corner at which the underfill resin feeding area is provided.

9. The wiring substrate according to claim 7, wherein the distance between the inner wall of the solder resist and the inner wall of the dam continuously decreases from the first distance to the second distance at each of two adjacent sides of the quadrangular-shaped inner wall of the solder resist which intersect at a corner opposite to the corner at which the underfill resin feeding area is provided.

10. The wiring substrate according to claim 9, wherein the inner wall of the dam provides a notched portion at a corner opposite to the corner at which the underfill resin feeding area is provided.

11. The wiring substrate according to claim 3, wherein the inner wall of the dam provides a notched portion at a corner opposite to the corner at which the underfill resin feeding area is provided.

12. The wiring substrate according to claim 1, wherein the inner wall of the solder resist defines a quadrangular shape so as to provide the opening portion with a quadrangular shape, and
the underfill resin feeding area is provided at only one side of the quadrangular-shaped inner wall of the solder resist, and is surrounded by a first area and a second area provided at said one side of the quadrangular-shaped inner wall of the solder resist, said first and second areas being areas other than the underfill resin feeding area.

13. The wiring substrate according to claim 12, wherein the underfill resin feeding area is substantially centrally disposed along said one side of the quadrangular-shaped inner wall of the solder resist.

14. The wiring substrate according to claim 13, wherein the distance between the between the inner wall of the solder resist and the inner wall of the dam decreases from the first distance at the underfill resin feeding area to the second distance at the first and second areas as a distance from a corner decreases.

15. The wiring substrate according to claim 12, wherein the distance between the inner wall of the solder resist and the inner wall of the dam at the first area, the second area, and at each of three sides of the quadrangular-shaped inner wall of the solder resist is the second distance.

16. The wiring substrate according to claim 1, wherein an entirety of the inner wall of the dam is disposed outwardly from the inner wall of the solder resist.

17. The wiring substrate according to claim 1, further comprising the underfill resin provided on the semiconductor element mounting area of the wiring substrate main body, wherein the dam has an upper surface which is opposite from a dam surface provided on the solder resist, and said underfill resin contacts the inner wall of the dam while the dam upper surface is entirely exposed from the underfill resin.

18. The wiring substrate according to claim 16, wherein an entirety of the inner wall of the solder resist defining the opening portion is disposed outwardly from the semiconductor element mounting area.

19. The wiring substrate according to claim 1, wherein an entirety of the inner wall of the solder resist defining the opening portion and the inner wall of the dam are disposed outwardly from the semiconductor element mounting area.

20. The wiring substrate according to claim 1, wherein
a portion of the inner wall of the dam is formed in a tapered shape in a plane view such that the distance between the inner wall of the opening portion of the solder resist and the inner wall of the dam decreases continuously from the first distance to the second distance.

21. A wiring substrate, comprising:
a wiring substrate main body having a semiconductor element mounting area in which a semiconductor element is mounted;
a wiring pattern provided on a first surface of the wiring substrate main body at a portion corresponding to the semiconductor element mounting area, and having connection portions to which the semiconductor element is flip-chip bonded;
a solder resist provided on the first surface of the wiring substrate main body, and an inner wall of the solder resist defining an opening portion whose size is substantially equal to the semiconductor element mounting area, when viewed from a top; and
a dam provided on an upper surface of the solder resist so as to surround the semiconductor element mounting area, for blocking an underfill resin provided in a clearance between the semiconductor element and the wiring substrate main body,
wherein
a distance between the inner wall of the solder resist defining the opening portion and an inner wall of the dam is varied, the distance comprising a first distance and a second distance which is smaller than the first distance, and a portion of the inner wall of the dam is formed in a tapered shape such that the distance between the inner wall of the opening portion of the solder resist and the inner wall of the dam decreases continuously from the first distance to the second distance.

* * * * *